(12) United States Patent
Yamazaki

(10) Patent No.: US 12,295,099 B2
(45) Date of Patent: May 6, 2025

(54) WIRING BOARD

(71) Applicant: SHINKO ELECTRIC INDUSTRIES CO., LTD., Nagano (JP)

(72) Inventor: Yuta Yamazaki, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 152 days.

(21) Appl. No.: 18/336,390

(22) Filed: Jun. 16, 2023

(65) Prior Publication Data

US 2024/0008179 A1    Jan. 4, 2024

(30) Foreign Application Priority Data

Jul. 4, 2022 (JP) ................................. 2022-107610

(51) Int. Cl.
*H05K 1/02* (2006.01)
*H05K 1/11* (2006.01)

(52) U.S. Cl.
CPC ........... *H05K 1/115* (2013.01); *H05K 1/0298* (2013.01); *H05K 2201/0195* (2013.01); *H05K 2201/09827* (2013.01)

(58) Field of Classification Search
CPC ................. H05K 1/115; H05K 1/0298; H05K 2201/09827; H05K 3/108; H05K 3/4661; H05K 2201/0195; H05K 2203/1476; H05K 3/4673
See application file for complete search history.

(56) References Cited

U.S. PATENT DOCUMENTS

| | | | | |
|---|---|---|---|---|
| 2011/0284277 | A1* | 11/2011 | Kato | H05K 1/113 |
| | | | | 174/258 |
| 2012/0188734 | A1* | 7/2012 | Mikado | H01L 24/19 |
| | | | | 361/761 |
| 2013/0284506 | A1* | 10/2013 | Zanma | H05K 1/185 |
| | | | | 29/832 |
| 2016/0234932 | A1* | 8/2016 | Oshima | H05K 3/4682 |
| 2016/0322295 | A1* | 11/2016 | Kobayashi | H05K 3/4682 |
| 2020/0092993 | A1 | 3/2020 | Taneda et al. | |
| 2020/0365500 | A1* | 11/2020 | Huang | H01L 23/49838 |
| 2021/0284833 | A1* | 9/2021 | Hayashi | C08G 18/69 |

(Continued)

FOREIGN PATENT DOCUMENTS

JP    2020-047735    3/2020

*Primary Examiner* — Steven T Sawyer
(74) *Attorney, Agent, or Firm* — IPUSA, PLLC

(57) ABSTRACT

A wiring board includes a first interconnect layer, a first insulating layer covering the first interconnect layer, a second interconnect layer including an interconnect pattern formed on an upper surface of the first insulating layer, and a via interconnect penetrating the first insulating layer and electrically connecting the interconnect pattern and the first interconnect layer, and a second insulating layer laminated on the first insulating layer. The second insulating layer includes a first insulating film laminated on the upper surface of the first insulating layer, and a second insulating film laminated on an upper surface of the first insulating film. The interconnect pattern has a recess in an upper surface thereof located at a position on the via interconnect. The first insulating film covers upper and side surfaces of the interconnect pattern, and fills the recess. The upper surface of the first insulating film is flatter than the interconnect pattern.

15 Claims, 6 Drawing Sheets

(56) References Cited

U.S. PATENT DOCUMENTS

| | | | |
|---|---|---|---|
| 2022/0087016 A1* | 3/2022 | Aratani | H05K 3/467 |
| 2022/0418106 A1* | 12/2022 | Ryu | H05K 1/0298 |
| 2023/0133282 A1* | 5/2023 | Ikeda | H05K 1/056 29/846 |

* cited by examiner

WIRING BOARD

CROSS-REFERENCE TO RELATED APPLICATIONS

This application is based upon and claims priority to Japanese Patent Application No. 2022-107610, filed on Jul. 4, 2022, the entire contents of which are incorporated herein by reference.

FIELD

Certain aspects of the embodiments discussed herein are related to wiring boards, and methods for manufacturing wiring boards.

BACKGROUND

Conventionally, there is a known wiring board having a plurality of interconnect layers and a plurality of insulating layers that are alternately laminated. In such a wiring board, adjacent interconnect layers are electrically connected to each other through a via hole formed in the insulating layer. Some wiring boards of this type have a fine (or micro) interconnect layer, as proposed in Japanese Laid-Open Patent Publication No. 2020-47735, for example.

However, a recess may be formed in an upper surface of the interconnect layer formed on the via hole. When the recess is foamed, a dimple is also formed in an upper surface of the insulating layer covering the interconnect layer, so as to follow a shape of the recess, and the upper surface of the insulating layer does not become flat. Such a dimple does not cause a problem in an interconnect layer having a relatively low interconnect density. However, as the interconnect layer becomes finer, it becomes more difficult to form the interconnect layer on the upper surface of the insulating layer formed with the dimple.

SUMMARY

Accordingly, it is an object in one aspect of the embodiments to provide a wiring board in which a fine interconnect layer can easily be formed.

According to one aspect of the embodiments, a wiring board includes a first interconnect layer; a first insulating layer covering the first interconnect layer; a second interconnect layer including an interconnect pattern formed on an upper surface of the first insulating layer, and a via interconnect penetrating the first insulating layer and electrically connecting the interconnect pattern and the first interconnect layer; and a second insulating layer laminated on the first insulating layer, wherein the second insulating layer includes a first insulating film laminated on the upper surface of the first insulating layer, and a second insulating film laminated on an upper surface of the first insulating film, the interconnect pattern has a recess in an upper surface thereof located at a position on the via interconnect, the first insulating film covers an upper surface and a side surface of the interconnect pattern, and fills the recess, and the upper surface of the first insulating film is flatter than the upper surface of the interconnect pattern.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
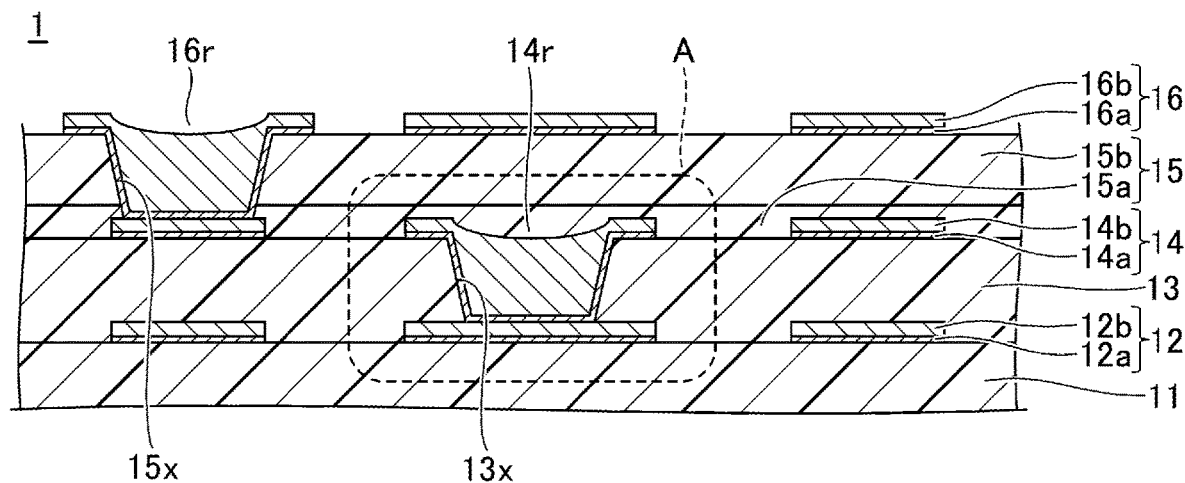
FIG. 1A and FIG. 1B are cross sectional views illustrating an example of a wiring board according to a first embodiment.

Preferred embodiments of the present disclosure will be described with reference to the accompanying drawings. In the drawings, those parts that are the same are designated by the same reference numerals, and a repeated description of the same parts may be omitted.

[Configuration of Wiring Board]

Figure 1B:
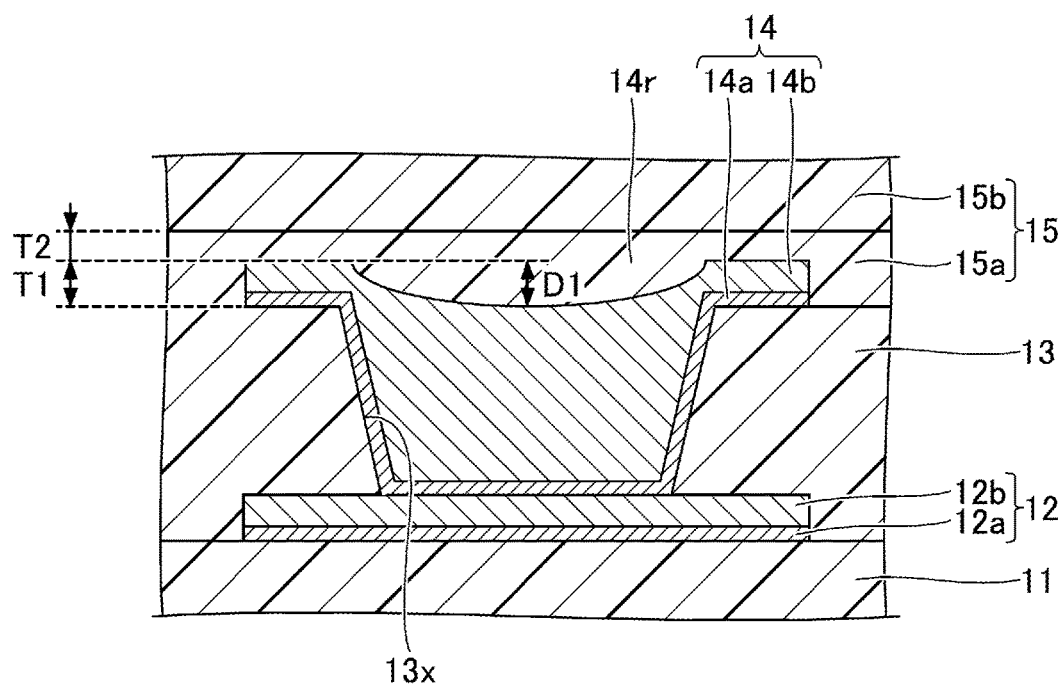

FIG. 1A and FIG. 1B are partial cross sectional views illustrating an example of a wiring board according to a first embodiment. FIG. 1A is an overall view of the wiring board, and FIG. 1B is an enlarged view of a part A in FIG. 1A.

As illustrated in FIG. 1A and FIG. 1B, a wiring board 1 includes an insulating layer 11, an interconnect layer 12, an insulating layer 13, an interconnect layer 14, an insulating layer 15, and an interconnect layer 16.

In the present embodiment, for the sake of convenience, the side of the wiring board 1 provided with the insulating layer 15 is referred to as an upper side or one side, and the side of the wiring board 1 provided with the insulating layer 11 is referred to as a lower side or the other side. In addition, a surface of each portion on the side provided with the insulating layer 15 is referred to as one surface or an upper surface, and a surface of each portion on the side provided with the insulating layer 11 is referred to as the other surface or a lower surface. However, the wiring board 1 can be used in an upside-down state, or can be used in a state inclined at an arbitrary angle. A plan view of an object refers to a view of the object in a normal direction to one surface (or upper surface) of the insulating layer 15, and a planar shape of the object refers to a shape of the object in the plan view viewed in the normal direction to the one surface (or upper surface) of the insulating layer 15.

The insulating layer 11 is an insulating layer that can be formed using a build-up method or the like, as an interlayer insulating layer of a multilayer interconnection (or multilevel interconnection), for example. Accordingly, another interconnect layer or another insulating layer may be laminated as a lower layer of the insulating layer 11. In this case, a via hole may be appropriately provided in the insulating layer 11 and the other insulating layer, and the interconnect layers can be electrically connected to each other through the via hole. Further, the insulating layer 11 may be a lowermost insulating layer.

The insulating layer 11 is an insulating layer including a photosensitive resin as a main component thereof. The insulating layer 11 may include a thermosetting photosensitive resin, such as a phenol-based resin, a polyimide-based resin, or the like, for example, as the main component thereof. The insulating layer 11 may include a filler, such as silica ($SiO_2$) or the like. The insulating layer including the photosensitive resin as the main component thereof is suitable for forming a fine interconnect layer, because a small via hole having an opening diameter in a range greater than or equal to approximately 15 µm and less than or equal to approximately 20 µm can easily be formed by an exposure process and a developing process.

The interconnect layer 12 is an interconnect pattern famed on an upper surface of the insulating layer 11. A thickness of the interconnect layer 12 can be in a range greater than or equal to approximately 1 µm and less than or equal to approximately 3 µm, for example. A line-and-space (line/space) of the interconnect layer 12 can be in a range of approximately 1 µm/1 µm to approximately 5 µm/5 µm, for example.

The line of the line-and-space represents an interconnect width, and the space of the line-and-space represents a spacing (interconnect spacing) between two adjacent interconnects. In a case where the line-and-space is indicated as 1 µm/1 µm to 5 µm/5 µm, for example, this represents an interconnect width greater than or equal to 1 µm and less than or equal to 5 µm, and a spacing (interconnect spacing) between two adjacent interconnects greater than or equal to 1 µm and less than or equal to 5 µm. The interconnect width and the interconnect spacing may not necessarily be equal to each other.

The interconnect layer 12 may have a configuration including an electrolytic plating layer 12b laminated on a seed layer 12a, for example. The seed layer 12a is a copper layer having a thickness in a range of approximately 100 nm to approximately 350 nm, for example. The seed layer 12a can be a laminated film including a copper layer having a thickness in a range of approximately 100 nm to approximately 300 nm, laminated on a titanium layer having a thickness in a range of approximately 20 nm to approximately 50 nm, for example. The electrolytic plating layer 12b is a copper layer having a thickness in a range greater than or equal to approximately 1 µm and less than or equal to approximately 3 µm, for example. Because the seed layer 12a is extremely thin, the thickness of the electrolytic plating layer 12b may be regarded as a thickness of the interconnect layer 12 as a whole. The same applies to the other interconnect layers.

The insulating layer 13 is formed on the upper surface of the insulating layer 11, so as to cover the interconnect layer 12. A material used for the insulating layer 13 can be the same the material used for the insulating layer 11, for example. A thickness of the insulating layer 13 can be in a range of approximately 5 µm to approximately 10 µm, for example. The insulating layer 13 may include a filler, such as silica ($SiO_2$) or the like. The insulating layer 13 is a typical example of a first insulating layer according to the present disclosure.

A via hole 13x, formed in the insulating layer 13, penetrates the insulating layer 13 and exposes an upper surface of the interconnect layer 12. The via hole 13x may be a cavity having an inverted truncated cone shape, and a diameter of a first opening of the cavity at one end which opens toward the insulating layer 15 is greater than a diameter of a second opening of the cavity at the other end, at a bottom surface of the cavity, formed by the upper surface of the interconnect layer 12. The diameter of the first opening of the via hole 13x can be in a range greater than or equal to approximately 15 Tim and less than or equal to approximately 20 µm, for example.

The interconnect layer 14 is formed on one surface of the insulating layer 13, and is electrically connected to the interconnect layer 12. The interconnect layer 14 includes an interconnect pattern formed on an upper surface of the insulating layer 13, and a via interconnect penetrating the insulating layer 13 and electrically connecting the interconnect pattern forming the interconnect layer 14 and the interconnect layer 12.

The via interconnect fills an inside of the via hole 13x. A thickness T1 of the interconnect pattern forming the interconnect layer 14 can be in a range greater than or equal to approximately 1 µm and less than or equal to approximately 3 µm, similar to the interconnect layer 12, for example. A line-and-space of the interconnect pattern forming the interconnect layer 14 can be the same as the line-and space of the interconnect layer 12, for example.

The interconnect layer 14 may have a configuration including an electrolytic plating layer 14b laminated on a seed layer 14a, for example. A material used for the seed layer 14a and a thickness of the seed layer 14a can be the same as those of the seed layer 12a, for example. A material used for the electrolytic plating layer 14b and a thickness of the electrolytic plating layer 14b can be the same as those of the electrolytic plating layer 12b, for example.

The interconnect pattern of the interconnect layer 14, located at a position on the via hole 13x, has a recess 14r that caves in from a peripheral edge toward a center of an upper surface thereof. The recess 14r has a bowl shape, for example. The bowl shape refers to a cup shape having a depth that gradually increases from the peripheral edge toward the center, and a rounded inner wall surface. A depth Dl of the recess 14r can be in a range greater than or equal to approximately 0.3 µm and less than or equal to approximately 1 µm, for example. A portion of the recess 14r may be located inside the via hole 13x. The depth Dl refers to a distance from the upper surface of the interconnect layer 14 to a deepest portion of the recess 14r.

The insulating layer 15 is laminated on the insulating layer 13. The insulating layer 15 includes a first insulating film 15a, and a second insulating film 15b. The insulating layer 15 is a typical example of a second insulating layer according to the present disclosure.

The first insulating film 15a is laminated on the upper surface of the insulating layer 13. The first insulating film 15a covers the upper surface and a side surface of the interconnect pattern forming the interconnect layer 14, and fills the recess 14r. An upper surface of the first insulating film 15a is flatter than the upper surface of the interconnect pattern forming the interconnect layer 14. The term "flat" means that no concave portion nor convex portion is formed at a target surface, or even if a concave portion or convex portion were famed at the target surface, a maximum depth of the concave portion and a maximum height of the convex portion are less than or equal to 0.1 µm. A thickness T2 of the first insulating film 15a can be in a range of approximately 0.5 µm to approximately 1 Tim, for example. The thickness T2 refers to a distance from the upper surface of the interconnect layer 14 to the upper surface of the first insulating film 15a.

The first insulating film 15a may include a filler, such as silica ($SiO_2$) or the like. A roughness Ra of the upper surface of the first insulating film 15a can be less than or equal to approximately 20 nm, for example.

The second insulating film 15b is laminated on the upper surface of the first insulating film 15a. Because the upper surface of the first insulating film 15a is flat, an upper surface of the second insulating film 15b, that is laminated on the upper surface of the first insulating film 15a, also becomes flat following the upper surface of the first insulating film 15a. In addition, because the roughness Ra of the upper surface of the first insulating film 15a is less than or equal to approximately 20 nm and small, a roughness of the upper surface of the second insulating film 15b, that is laminated on the upper surface of the first insulating film 15a, also becomes small following the upper surface of the first insulating film 15a. For this reason, it becomes easy to form a fine interconnect layer on the upper surface of the second insulating film 15b.

A thickness of the second insulating film 15b can be in a range of approximately 6 μm to approximately 8 μm, for example. A sum of the thicknesses of the first insulating film 15a and the second insulating film 15b can be the same as the thickness of the insulating layer 13, for example. A material used for the first insulating film 15a and the second insulating film 15b can include a photosensitive resin as a main component thereof, for example, similar to the insulating layer 11 and the insulating layer 13. The second insulating film 15b may include a filler, such as silica ($SiO_2$) or the like.

The first insulating film 15a is an insulating layer that is provided to fill the recess 14r and to flatten an upper surface of the insulating layer 15. On the other hand, the second insulating film 15b is an insulating layer that is provided to ensure a predetermined thickness of the insulating layer 15 to function normally as an interlayer insulating layer. For this reason, the first insulating film 15a can be thinner than the second insulating film 15b.

A via hole 15x, formed in the insulating layer 15, penetrates the first insulating film 15a and the second insulating film 15b and exposes the upper surface of the interconnect layer 14. The via hole 15x may be a cavity having an inverted truncated cone shape, and a diameter of a first opening of the cavity at one end which opens toward the upper surface of the insulating layer 15 is greater than a diameter of a second opening of the cavity at the other end, at a bottom surface of the cavity, formed by the upper surface of the interconnect layer 14. The diameter of the first opening of the via hole 15x can be in a range greater than or equal to approximately 15 μm and less than or equal to approximately 20 for example.

Even in a case where the same material is used for the first insulating film 15a and the second insulating film 15b, a boundary between the first insulating film 15a and the second insulating film 15b can be observed and confirmed using an optical microscope.

The interconnect layer 16 is formed on one surface of the insulating layer 15, and is electrically connected to the interconnect layer 14. The interconnect layer 16 includes an interconnect pattern formed on the upper surface of the insulating layer 15, and a via interconnect penetrating the insulating layer 15 and electrically connecting the interconnect pattern forming the interconnect layer 16 and the interconnect layer 14. The via interconnect fills an inside of the via hole 15x. A line-and-space of the interconnect pattern forming the interconnect layer 16 can be the same as the line-and-space of the interconnect layer 12, for example.

The interconnect layer 16 may have a configuration including an electrolytic plating layer 16b laminated on a seed layer 16a, for example. A material used for the seed layer 16a and a thickness of the seed layer 16a can be the same as those of the seed layer 12a, for example. A material used for the electrolytic plating layer 16b and a thickness of the electrolytic plating layer 16b can be the same as those of the electrolytic plating layer 12b, for example.

The interconnect pattern of the interconnect layer 16, located at a position on the via hole 15x, has a recess 16r that caves in from a peripheral edge toward a center of an upper surface thereof. The recess 16r has a bowl shape similar to the recess 14r, for example. A depth of the recess 16r can be in a range greater than or equal to approximately 0.3 μm and less than or equal to approximately 1 μm, for example, similar to the recess 14r. A portion of the recess 16r may be located inside the via hole 15x.

As described above, in the wiring board 1, even in the case where the recess 14r is formed in the interconnect layer 14, the recess 14r is filled with the first insulating film 15a, and the upper surface of the first insulating film 15a is planarized and flat. For this reason, the upper surface of the second insulating film 15b is also flat by following the flat upper surface of the first insulating film 15a. Hence, it is possible to stably form the interconnect layer 16, that is a fine interconnect layer, on the second insulating film 15b. As a result, it is possible to improve the reliability of the wiring board 1 having the fine interconnect layer.

In a conventional wiring board not formed with a fine interconnect layer, even if a recess having a depth of approximately 1 μm were formed in the upper surface of the interconnect layer and a concave portion having a depth of approximately 1 μm were formed in the upper surface of the insulating layer covering the interconnect layer following the concave portion, no problem would occur. This is because the interconnect layer, that is formed on the upper surface of the insulating layer, is sufficiently thick with respect to the depth of the recess, and has a relatively large line-and-space.

In contrast, in the case of the wiring board having the fine interconnect layer, if a recess having a depth of approximately 1 μm were formed in the upper surface of the interconnect layer and a concave portion having a depth of approximately 1 μm were formed in the upper surface of the insulating layer covering the interconnect layer following the recess, it would become difficult to foam the fine interconnect layer. This is because, in the fine interconnect layer, the thickness of the interconnect pattern is in a range greater than or equal to 1 μm and less than or equal to 3 μm, and the line-and-space is in a range greater than or equal to 1 μm/1 μm and less than or equal to 5 μm/5 μm, for example, and the thickness and the line-and-space of the interconnect pattern become approximately the same as the depth of the recess.

For this reason, the technique of filling the recess 14r of the interconnect layer 14 with the first insulating film 15a, planarizing the upper surface of the first insulating film 15a, and consequently planarizing the upper surface of the second insulating film 15b, is extremely effective for a wiring board having a fine interconnect layer, such as the wiring board 1.

[Method for Manufacturing Wiring Board]

Next, a method for manufacturing the wiring board according to the first embodiment will be described. FIG. 2A through FIG. 5C are diagrams illustrating examples of manufacturing processes of the wiring board according to the first embodiment.

Figure 2A:
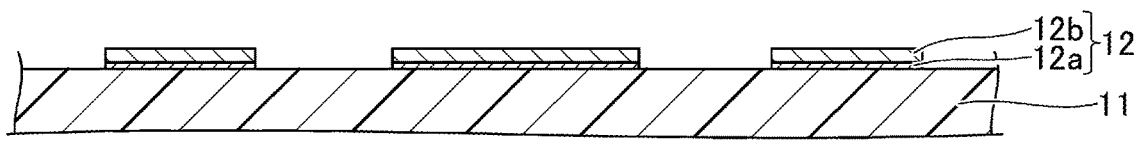
FIG. 2A, FIG. 2B, FIG. 2C, and FIG. 2D are diagrams (part 1) illustrating examples of manufacturing processes of the wiring board according to the first embodiment.

First, in a process (or step) illustrated in FIG. 2A, the insulating layer 11 provided with the interconnect layer 12 is prepared. The insulating layer 11 includes a thermosetting photosensitive resin, such as a phenol-based resin, a polyimide-based resin, or the like, for example, as a main component thereof. The interconnect layer 12 can be formed on the insulating layer 11 by a semi-additive method, for example. In this case, the interconnect layer 12 may have a configuration including the electrolytic plating layer 12b made of copper laminated on the seed layer 12a made of an electroless plating film or a sputtered film of copper, for example.

Figure 2B:
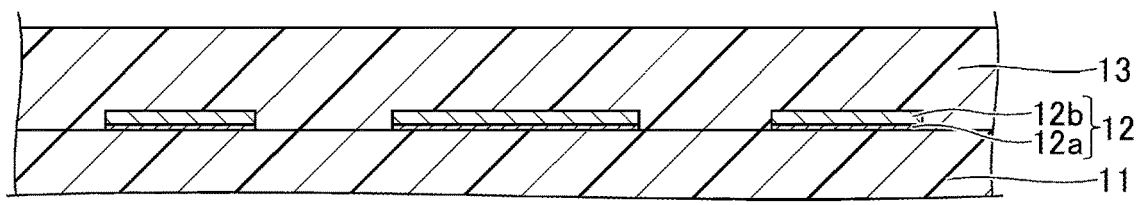

Next, in a process (or step) illustrated in FIG. 2B, the insulating layer 13 is formed on the upper surface of the insulating layer 11, so as to cover the interconnect layer 12. More particularly, a liquid or paste of an insulating resin, including a thermosetting photosensitive resin, such as a phenol-based resin, a polyimide-based resin, or the like, for example, as a main component thereof, is prepared and coated on the upper surface of the insulating layer 11 by spin coating or the like, so as to cover the interconnect layer 12. Then, the coated insulating resin is heated, to foam the insulating layer 13 in a semi-cured state.

Figure 2C:
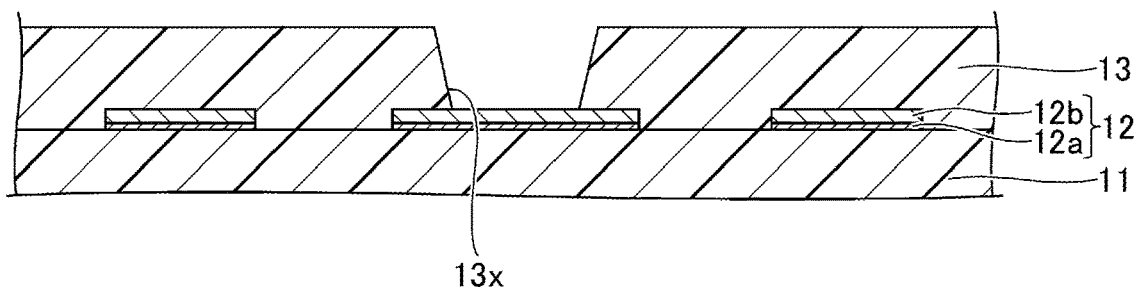
Figure 2D:
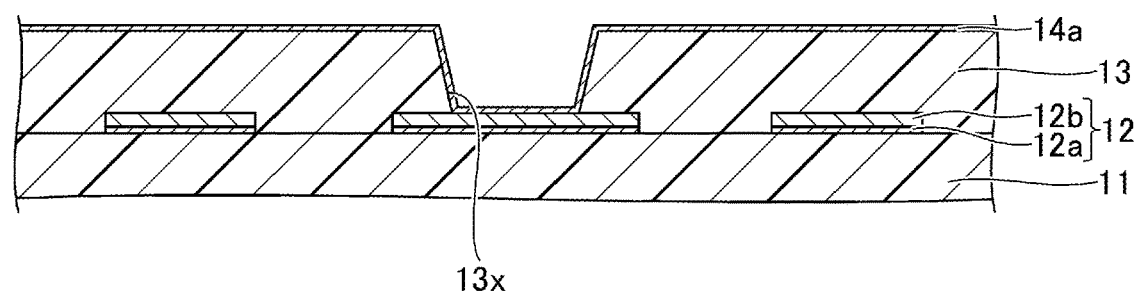

Next, in a process (or step) illustrated in FIG. 2C, the via hole 13x, that penetrates the insulating layer 13 and exposes the upper surface of the interconnect layer 12, is formed in the insulating layer 13. The via hole 13x can be formed by photolithography, for example. That is, the via hole 13x can be formed by exposing and developing the insulating layer 13 including the photosensitive resin as the main component thereof. Thereafter, the insulating layer 13 in the semi-cured state is heated and cured. The via hole 13x becomes a cavity having an inverted truncated cone shape, and a diameter of a first opening of the cavity at one end which opens toward the insulating layer 15 is greater than a diameter of a second opening of the cavity at the other end, at a bottom surface of the cavity, formed by the upper surface of the interconnect layer 12. The diameter of the first opening of the via hole 13x can be in a range greater than or equal to approximately 15 μm and less than or equal to approximately 20 μm, for example.

Next, in processes (or steps) illustrated in FIG. 2D through FIG. 4A, the interconnect layer 14 is formed on the insulating layer 13. First, in the process (or step) illustrated in FIG. 2D, the seed layer 14a is formed on the surface of the insulating layer 13 including the inner wall of the via hole 13x, and on the surface of the interconnect layer 12 exposed inside the via hole 13x, by electroless plating or sputtering. The material used for the seed layer 14a and the thickness of the seed layer 14a are as described above.

Figure 3A:
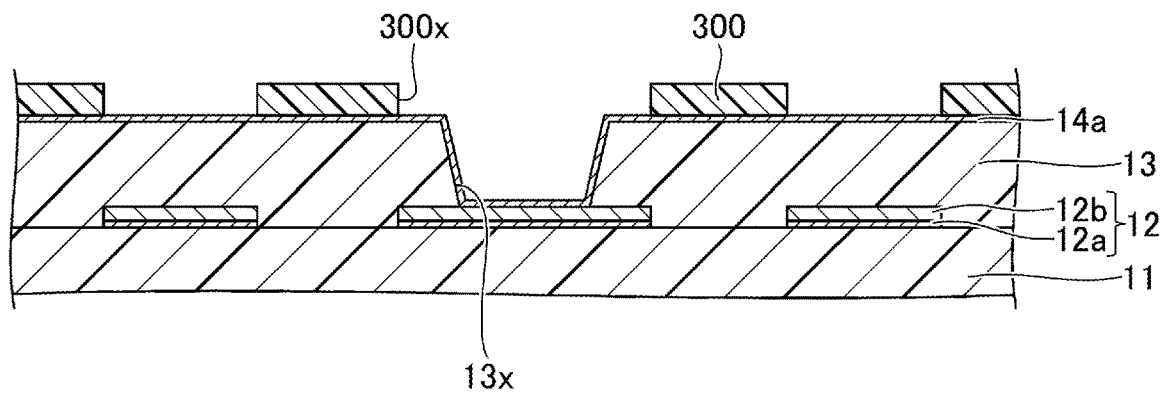
FIG. 3A, FIG. 3B, and FIG. 3C are diagrams (part 2) illustrating examples of the manufacturing processes of the wiring board according to the first embodiment.
Figure 3B:
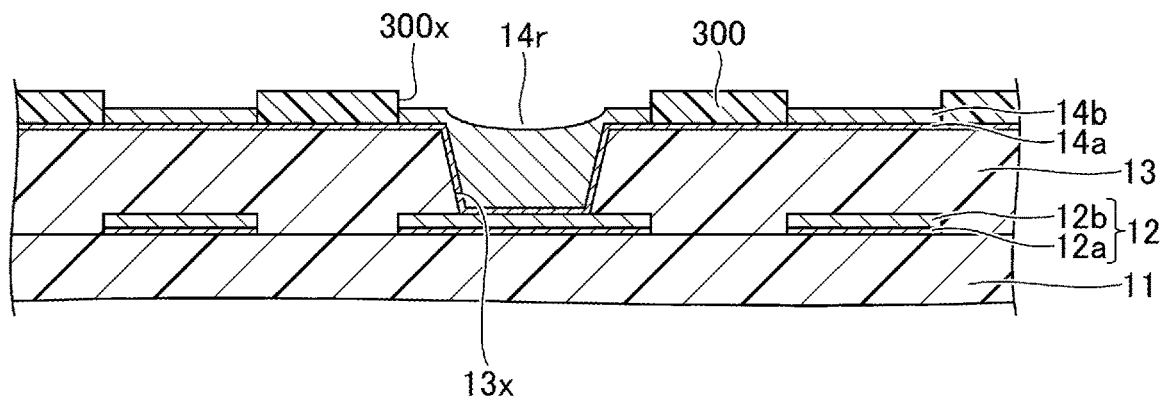
Figure 3C:
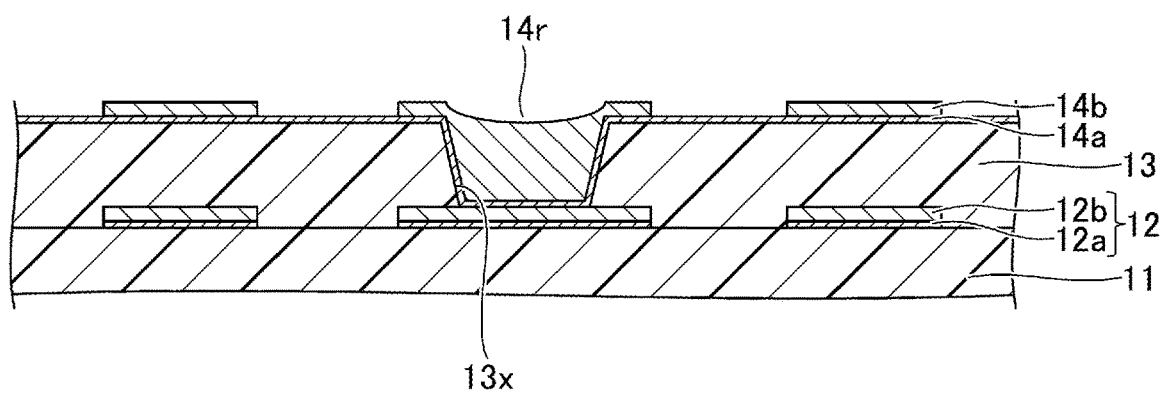

Next, in the process (or step) illustrated in FIG. 3A, a plating resist pattern 300, having an opening 300x corresponding to the shape of the interconnect pattern of the interconnect layer 14, is famed on the seed layer 14a. Next, in the process (or step) illustrated in FIG. 3B, an electrolytic plating layer 14b is deposited on the seed layer 14a exposed inside the opening 300x of the plating resist pattern 300, by electrolytic plating of copper using the seed layer 14a as a power feeding layer. Next, in the process (or step) illustrated in FIG. 3C, the plating resist pattern 300 is removed using a plating resist remover. In the process (or step) illustrated in FIG. 3B, the recess 14r that caves in from the peripheral edge toward the center of the upper surface of the interconnect pattern of the interconnect layer 14, is located at the position on the via hole 13x. The recess 14r has the bowl shape having the depth in the range greater than or equal to approximately 0.3 μm and less that or equal to approximately 1 μm, for example.

Figure 4A:
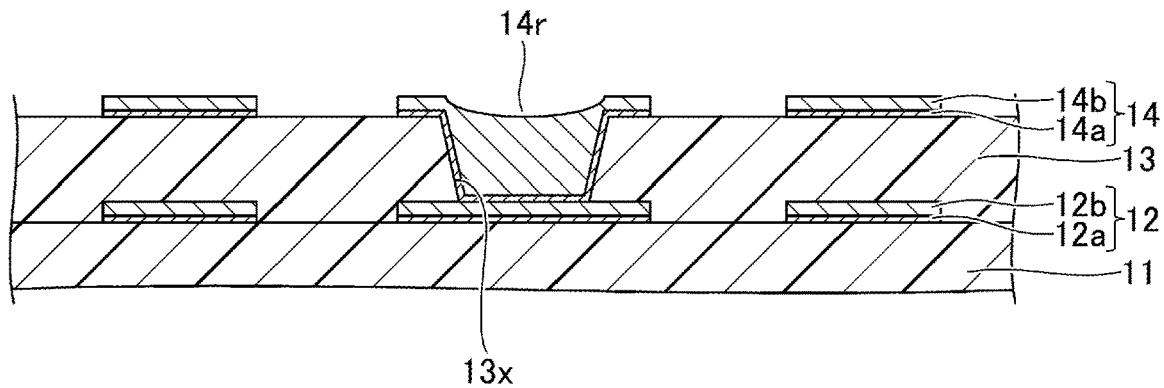
FIG. 4A, FIG. 4B, and FIG. 4C are diagrams (part 3) illustrating examples of the manufacturing processes of the wiring board according to the first embodiment.
Figure 4B:
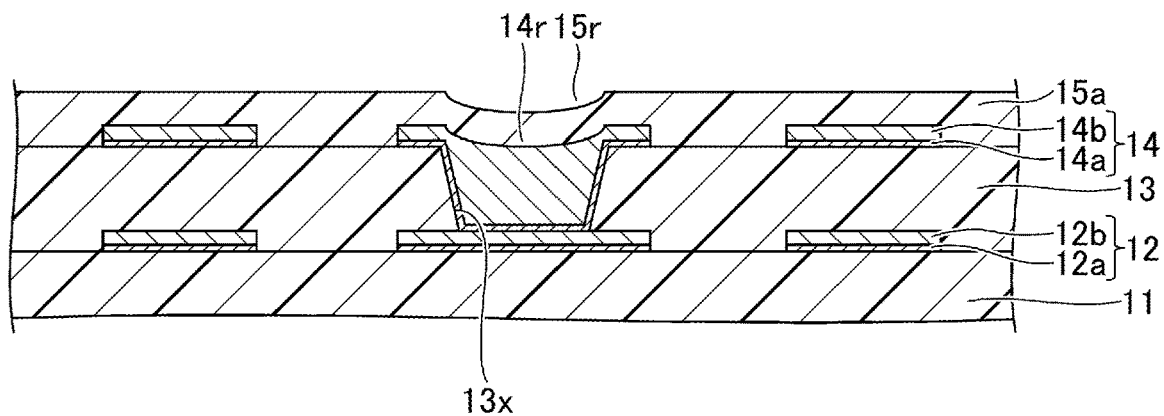

Next, in the process (or step) illustrated in FIG. 4A, etching is performed using the electrolytic plating layer 14b as a mask, so as to remove the seed layer 14a exposed from the electrolytic plating layer 14b and form the interconnect layer 14. Thus, the interconnect layer 14, including the interconnect pattern formed on the upper surface of the insulating layer 13, and the via interconnect penetrating the insulating layer 13 and electrically connecting the interconnect pattern and the interconnect layer 12, is formed.

Next, in processes (or steps) illustrated in FIG. 4B through FIG. 5A, the insulating layer 15 is laminated on the insulating layer 13. First, in the process (or step) illustrated in FIG. 4B, a liquid or paste of an insulating resin including a thermosetting photosensitive resin, such as a phenol-based resin, a polyimide-based resin, or the like, as a main component thereof, is prepared and coated on the upper surface of the insulating layer 13 by spin coating or the like, so as to cover the interconnect layer 14. Then, the coated insulating resin is heated, to form the first insulating film 15a in a semi-cured state. Hence, the first insulating film 15a covering the upper surface and the side surface of the interconnect pattern of the interconnect layer 14, filling the recess 14r, and having a dimple 15r along the recess 14r, is laminated on the upper surface of the insulating layer 13.

The thickness of the first insulating film 15a is preferably in a range greater than or equal to 250% and less than or equal to 300% with respect to the depth of the recess 14r. When the thickness of the first insulating film 15a is greater than or equal to 250% with respect to the depth of the recess 14r, it is possible to sufficiently fill the recess 14r with the first insulating film 15a. In addition, when the thickness of the first insulating film 15a is less than or equal to 300% with respect to the depth of the recess 14r, it is possible to prevent the first insulating film 15a from becoming unnecessarily thick, and to prevent a polishing time of a polishing process (or step) that will be described later from becoming long.

Figure 4C:
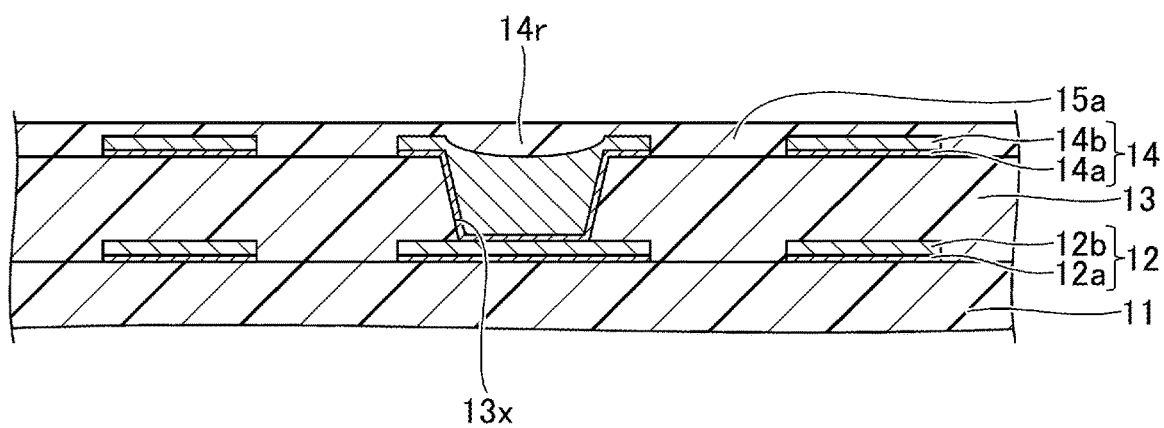

Next, in the process (or step) illustrated in FIG. 4C, the first insulating film 15a is polished until the dimple 15r is eliminated, so that the upper surface of the first insulating film 15a becomes flatter than the upper surface of the interconnect pattern forming the interconnect layer 14. For example, chemical mechanical polishing (CMP) can be used for the polishing. The thickness of the first insulating film 15a after the polishing can be in a range of approximately 0.5 μm to approximately 1 μm, for example. The roughness Ra of the upper surface of the first insulating film 15a after polishing can be less than or equal to approximately 20 nm, for example.

Figure 5A:
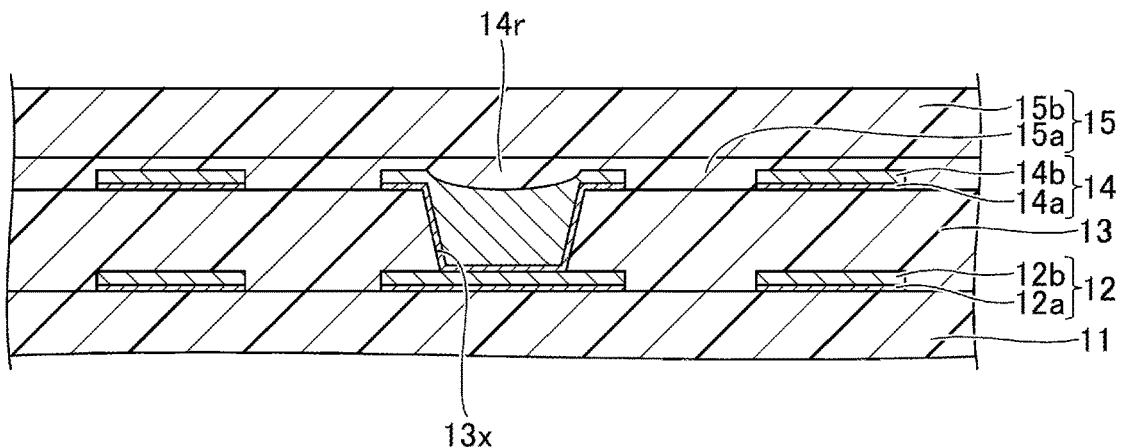
FIG. 5A, FIG. 5B, and FIG. 5C are diagrams (part 4) illustrating examples of the manufacturing processes of the wiring board according to the first embodiment.

Next, in the process (or step) illustrated in FIG. 5A, the second insulating film 15b is laminated on the upper surface of the first insulating film 15a. More particularly, a liquid or paste of an insulating resin, including a thermosetting photosensitive resin, such as a phenol-based resin, a polyimide-based resin, or the like, for example, as a main component thereof, is prepared and coated on the upper surface of the first insulating film 15a by spin coating or the like. Then, the coated insulating resin is heated, to form the second insulating film 15b in a semi-cured state. Thus, the insulating layer 15 in the semi-cured state is formed on the insulating layer 13. The thickness of the insulating layer 15 can be in a range of approximately 6 μm to approximately 8 μm, for example. Because the upper surface of the first insulating film 15a is planarized and flat, the upper surface of the second insulating film 15b is also planarized and flat following the upper surface of the first insulating film 15a.

Figure 5B:
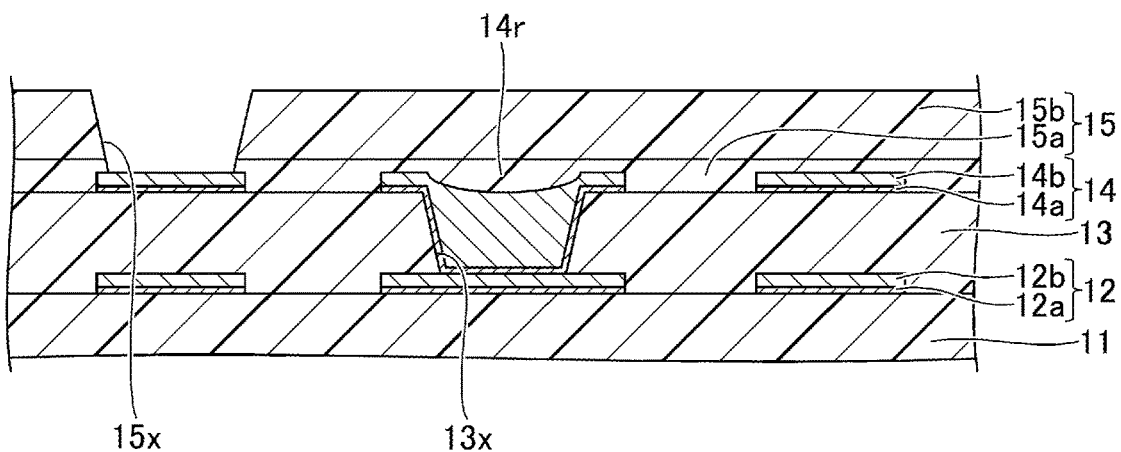

Next, in the process (or step) illustrated in FIG. 5B, the via hole 15x, that penetrates the insulating layer 15 and exposes the upper surface of the interconnect layer 14, is formed in the insulating layer 15. The via hole 15x can be famed by photolithography, similar to the process illustrated in FIG. 2C, for example. Thereafter, the insulating layer 15 in the semi-cured state is heated and cured. The via hole 15x becomes a cavity having an inverted truncated cone shape, and a diameter of a first opening of the cavity at one end which opens toward the upper surface of the insulating layer 15 is greater than a diameter of a second opening of the cavity at the other end, at a bottom surface of the cavity, formed by the upper surface of the interconnect layer 14. The diameter of the first opening of the via hole 15x can be in a range greater than or equal to approximately 15 μm and less than or equal to approximately 20 μm, for example.

Figure 5C:
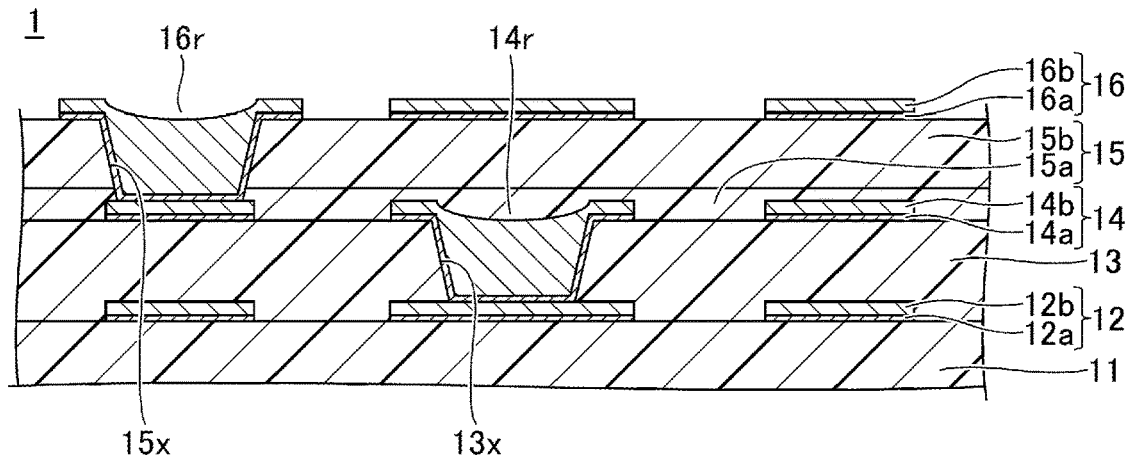

Next, in the process (or step) illustrated in FIG. 5C, the interconnect layer 16, including the interconnect pattern formed on the upper surface of the insulating layer 15 and the via interconnect penetrating the insulating layer 15 and electrically connecting the interconnect pattern and the interconnect layer 14, is formed, similar to FIG. 2D through FIG. 4A. The interconnect layer 16 may have a configuration including the electrolytic plating layer 16b laminated on the seed layer 16a. The wiring board 1 is completed by the processes described above. After the process illustrated in FIG. 5C, a predetermined number of insulating layers and a predetermined number of interconnect layers can further be laminated, as required. In this case, when the insulating layer covering the interconnect layer is made to have a two-layer structure similar to the insulating layer 15, a fine interconnect layer can be formed on the insulating layer.

Application Example 1 of First Embodiment

An application example 1 of the first embodiment is an example of a semiconductor device having a semiconductor chip mounted on a laminated wiring board in which a wiring board having a fine interconnect layer is mounted on a base substrate. In the application example 1 of the first embodiment, a description of constituent elements that are the same as those of the embodiment described above may be omitted.

Figure 6:
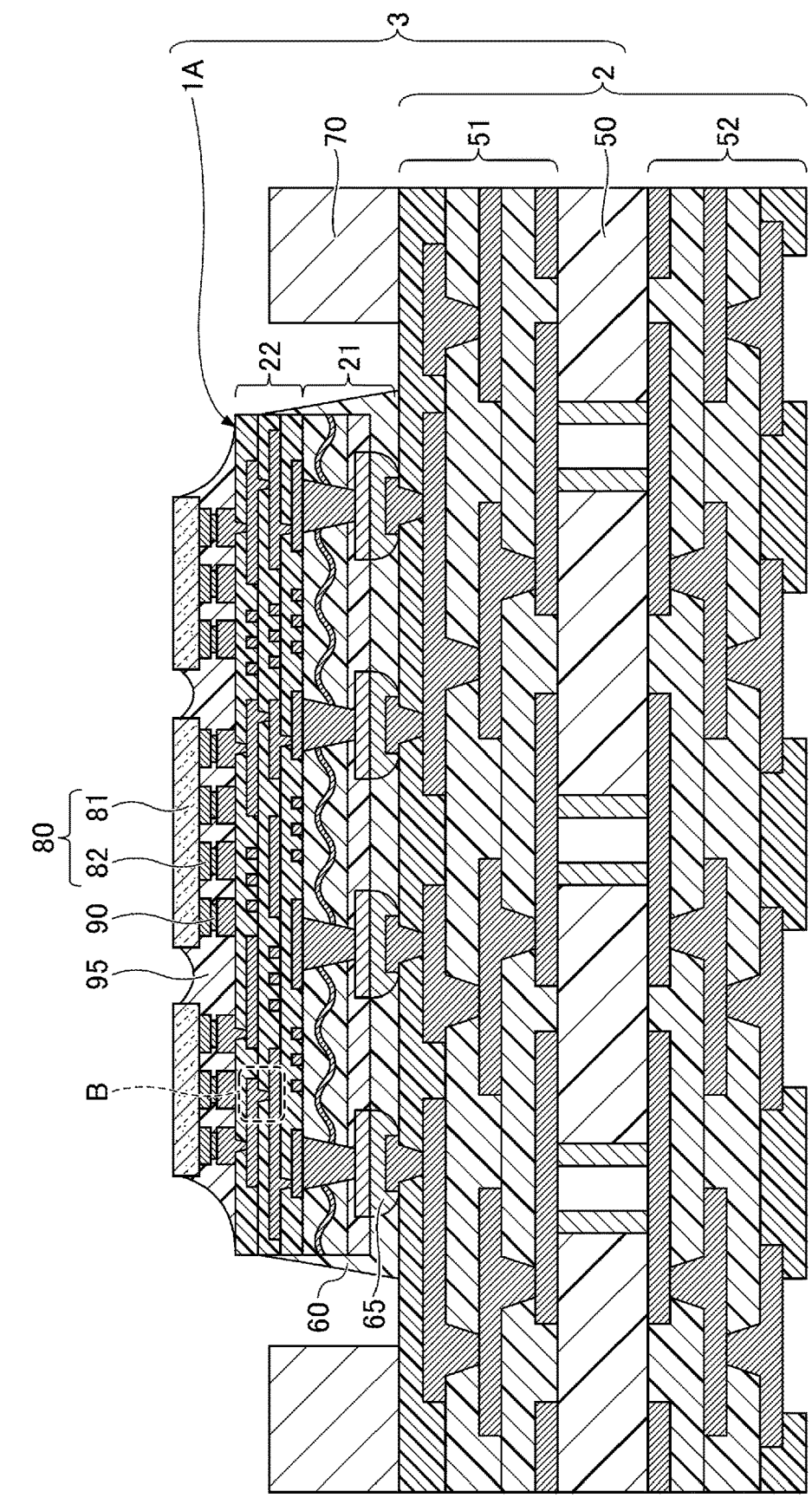
FIG. 6 is a cross sectional view illustrating an example of a semiconductor device according to an application example of the first embodiment.

FIG. 6 is a cross sectional view illustrating an example of a semiconductor device according to an application example of the first embodiment. As illustrated in FIG. 6, a semiconductor device 5 includes a laminated wiring board 3, a plurality of semiconductor chips 80, and an underfill resin 95. The plurality of semiconductor chips 80 is flip-chip bonded to the laminated wiring board 3.

The laminated wiring board 3 is a multilayer wiring board in which a wiring board 1A is mounted on the base substrate 2. The laminated wiring board 3 can be manufactured by a known build-up method, for example.

The base substrate 2 is a multilayer interconnection substrate in which a first laminated body 51 is laminated on one side of a core layer 50, and a second laminated body 52 is laminated on the other side of the core layer 50. Each of the first laminated body 51 and the second laminated body 52 includes a plurality of interconnect layers and a plurality of insulating layers that are successively laminated from the side of the core layer 50, and a solder resist layer formed as an outermost layer.

The wiring board 1A is fixed on the base substrate 2 by a bonding layer (or adhesive layer) 60. The interconnect layer of the wiring board 1A is electrically connected to the interconnect layer of the base substrate 2 via solder bumps 65. The bonding layer 60 is filled between a lower surface of the wiring board 1A and an upper surface of the base substrate 2, covers a portion of a side surface of the wiring board 1A, and bonds the wiring board 1A and the base substrate 2 to each other.

The wiring board 1A has a first interconnect structure 21, and a second interconnect structure 22 disposed on the first interconnect structure 21. The first interconnect structure 21 includes a reinforcing member, and serves as a base for forming the second interconnect structure 22. The second interconnect structure 22 is an interconnect structure including a plurality of interconnect layers and a plurality of insulating layers that are laminated.

An interconnect width and an interconnect spacing of each interconnect layer forming the second interconnect structure 22 are respectively smaller than an interconnect width and an interconnect spacing of each interconnect layer forming the base substrate 2. In other words, each interconnect layer forming the second interconnect structure 22 is a fine interconnect layer having a higher interconnect density than a line-and-space of each interconnect layer forming the base substrate 2.

The line-and-space of each interconnect layer forming the base substrate 2 can be in a range of approximately 10 μm/10 μm to approximately 20 μm/20 μm, for example. A line-and-space of each interconnect layer forming the second interconnect structure 22 can be in a range of approximately 1 μm/1 μm to approximately 5 μm/5 μm, for example.

A part B of the second interconnect structure 22 surrounded by a broken line employs a structure similar to the part A of the wiring board 1 according to the first embodiment illustrated in FIG. 1B. That is, the insulating layer forming the second interconnect structure 22 has a two-layer structure in which a first insulating film fills and planarizes a recess formed in an upper surface of an interconnect layer located at a position on a via hole, and a second insulating film is laminated on the first insulating film. Accordingly, because an upper surface of the second insulating film becomes a flat surface, it is possible to foam a fine interconnect layer.

A stiffener 70 is fixed to an outer periphery of the upper surface of the base substrate 2. The stiffener 70 has a planar shape that is a picture-frame shape, for example, and is provided to reinforce a strength of the laminated wiring board 3 as a whole, and to reduce warping that occurs when mounting the laminated wiring board 3 on a mother board or the like. A material used for the stiffener 70 may be SUS304 (stainless steel including Cr and Ni as main components thereof: 0.08C-18Cr-8Ni) or the like, for example. The material used for the stiffener 70 may also be a metal plate formed of copper, copper alloy, or the like, or a resin plate formed of a glass epoxy substrate or the like, for example. The stiffener 70 can be provided, as required.

The plurality of semiconductor chips 80 is flip-chip bonded to the laminated wiring board 3.

The semiconductor chip 80 includes a semiconductor integrated circuit (not illustrated) or the like famed on a thinned semiconductor substrate 81 made of silicon or the like, for example. Electrode pads 82, electrically connected to the semiconductor integrated circuit (not illustrated), are formed on a circuit formation surface of the semiconductor substrate 81.

The electrode pads 82 of the semiconductor chip 80 are electrically connected to the uppermost interconnect layer of the wiring board 1A via bumps 90. The underfill resin 95 is filled between the circuit formation surface of the semiconductor chip 80 and the upper surface of the wiring board 1A, and covers a side surface of the semiconductor chip 80. The bumps 90 are solder bumps, for example. A material used for the solder bump can be SnBi solder or the like, for example.

Accordingly, by mounting the wiring board 1A having the interconnect layer with a high interconnect density on the base substrate 2 having the interconnect layer with a low interconnect density, it is possible to easily manufacture the laminated wiring board 3 that can be mounted with the semiconductor chips 80. Further, the semiconductor device 5 can be obtained by mounting the semiconductor chips 80 on the laminated wiring board 3.

Although preferred embodiments are described above in detail, the present invention is not limited to the above described embodiments, and various variations, modifications, and substitutions can be made in the above described embodiments without departing from the scope of the present invention.

According to the disclosed technique, it is possible to provide a wiring board in which a fine interconnect layer can easily be formed.

Various aspects of the subject-matter described herein may be set out non-exhaustively in the following numbered clauses:

1. A method for manufacturing a wiring board, comprising:
    foaming a first insulating layer covering a first interconnect layer;
    foaming a second interconnect layer including an interconnect pattern formed on an upper surface of the first insulating layer, and a via interconnect penetrating the first insulating layer and electrically connecting the interconnect pattern and the first interconnect layer; and
    foaming a second insulating layer on the first insulating layer, wherein
    the forming the second interconnect layer forms a recess in an upper surface of the interconnect pattern located at a position on the via interconnect, and
    the forming the second insulating layer includes
        laminating, on the upper surface of the first insulating layer, a first insulating film covering the upper surface and a side surface of the interconnect pattern, filling the recess, and including a dimple along the recess,
        polishing the first insulating film until the dimple is eliminated, so that an upper surface of the first insulating film is flatter than the upper surface of the interconnect pattern; and
        laminating a second insulating film on the upper surface of the first insulating film.

2. The method for manufacturing the wiring board according to clause 1, wherein a thickness of the first insulating film before the polishing is in a range greater than or equal to 250% and less than or equal to 300% of a depth of the recess.

3. The method for manufacturing the wiring board according to clause 1 or 2, wherein a roughness Ra of the upper surface of the first insulating film after the polishing is less than or equal to 20 nm.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
    a first interconnect layer;
    a first insulating layer covering the first interconnect layer;
    a second interconnect layer including a first interconnect pattern formed on an upper surface of the first insulating layer, and a first via interconnect penetrating the first insulating layer and electrically connecting the first interconnect pattern and the first interconnect layer;
    a second insulating layer provided on the first insulating layer; and
    a third interconnect layer provided on the second insulating layer, wherein
    the second insulating layer includes a first insulating film provided on the upper surface of the first insulating layer, and a second insulating film provided on an upper surface of the first insulating film,
    the first interconnect pattern has a recess in an upper surface thereof located at a position on the first via interconnect,
    the first insulating film covers an upper surface and a side surface of the first interconnect pattern, and fills the recess,
    the upper surface of the first insulating film is flatter than the upper surface of the first interconnect pattern,
    the first insulating film is thinner than the second insulating film,
    the third interconnect layer includes a second interconnect pattern formed on an upper surface of the second insulating film, and a second via interconnect penetrating the first insulating film and the second insulating film, and
    the second via interconnect of the third interconnect layer electrically connects the second interconnect layer and the third interconnect layer.

2. The wiring board as claimed in claim 1, wherein the first insulating film and the second insulating film include a photosensitive resin as a main component thereof.

3. The wiring board as claimed in claim 1, wherein
    an interconnect width of an interconnect pattern of the first interconnect layer is in a range greater than or equal to 1 μm and less than or equal to 5 μm, and
    an interconnect spacing of the interconnect pattern of the first interconnect layer is in a range greater than or equal to 1 μm and less than or equal to 5 μm.

4. The wiring board as claimed in claim 1, wherein a thickness of an interconnect pattern of the first interconnect layer is in a range greater than or equal to 1 μm and less than or equal to 3 μm.

5. The wiring board as claimed in claim 1, wherein a roughness Ra of the upper surface of the first insulating film is less than or equal to 20 nm.

6. The wiring board as claimed in claim 1, wherein
    the first via interconnect fills an inside of a via hole penetrating the first insulating layer and exposing an upper surface of the first interconnect layer,
    the via hole is a cavity having an inverted truncated cone shape, and a diameter of a first opening of the cavity at one end which opens toward the second insulating layer is greater than a diameter of a second opening of the cavity at the other end, at a bottom surface of the cavity, formed by the upper surface of the first interconnect layer, and the diameter of the first opening of the via hole is in a range greater than or equal to 15 μm and less than or equal to 20 μm.

7. The wiring board as claimed in claim 1, wherein the recess of the first interconnect pattern has a bowl or cup shape having a depth that gradually increases from a peripheral edge thereof toward a center of the bowl or cup shape, and a rounded inner wall surface.

8. The wiring board as claimed in claim 1, wherein a depth of the recess of the first interconnect pattern is in a range greater than or equal to 0.3 μm and less than or equal to 1 μm.

9. The wiring board as claimed in claim 1, wherein:
the first interconnect pattern of the second interconnect layer has a thickness in a range greater than or equal to 1 μm and less than or equal to 3 μm, and
the first insulating film of the second insulating layer has a thickness in a range greater than or equal to 0.5 μm and less than or equal to 1 μm.

10. The wiring board as claimed in claim 1, wherein the second interconnect pattern of the third interconnect layer is provided above the recess of the first interconnect layer of the second interconnect layer.

11. A semiconductor device comprising:
the wiring board according to claim 1; and
a semiconductor chip provided on the wiring board and electrically connected to the third interconnect layer.

12. The wiring board as claimed in claim 1, wherein
an interconnect width of the first interconnect pattern of the second interconnect layer is in a range greater than or equal to 1 μm and less than or equal to 5 μm, and
an interconnect spacing of the first interconnect pattern of the second interconnect layer is in a range greater than or equal to 1 μm and less than or equal to 5 μm.

13. The wiring board as claimed in claim 1, wherein a thickness of the first interconnect pattern of the second interconnect layer is in a range greater than or equal to 1 μm and less than or equal to 3 μm.

14. The wiring board as claimed in claim 1, wherein
an interconnect width of the second interconnect pattern of the third interconnect layer is in a range greater than or equal to 1 μm and less than or equal to 5 μm, and
an interconnect spacing of the second interconnect pattern of the third interconnect layer is in a range greater than or equal to 1 μm and less than or equal to 5 μm.

15. The wiring board as claimed in claim 1, wherein a thickness of the second interconnect pattern of the third interconnect layer is in a range greater than or equal to 1 μm and less than or equal to 3 μm.

* * * * *